United States Patent [19]

Pedder

[11] Patent Number: 5,747,870
[45] Date of Patent: May 5, 1998

[54] MULTI-CHIP MODULE INDUCTOR STRUCTURE

[75] Inventor: David John Pedder, Warwickshire, Great Britain

[73] Assignee: Plessey Semiconductors Limited, United Kingdom

[21] Appl. No.: 483,462

[22] Filed: Jun. 8, 1995

[30] Foreign Application Priority Data

Jun. 30, 1994 [GB] United Kingdom ............... 9413145

[51] Int. Cl.[6] .................................................. H01L 29/00
[52] U.S. Cl. ................................................. 257/531; 257/528
[58] Field of Search .................................. 257/531, 700, 257/714, 717, 737

[56] References Cited

U.S. PATENT DOCUMENTS

| | | | |
|---|---|---|---|
| 3,614,554 | 10/1971 | Shield | 257/531 |
| 3,798,059 | 3/1974 | Astle et al. | |
| 4,758,808 | 7/1988 | Sasaki et al. | 333/185 |
| 4,825,284 | 4/1989 | Soga et al. | 257/717 |
| 5,130,779 | 7/1992 | Agarwala et al. | 257/737 |
| 5,313,361 | 5/1994 | Martin | 257/714 |
| 5,416,356 | 5/1995 | Staudinger et al. | 257/531 |
| 5,488,542 | 1/1996 | Ito | 257/700 |
| 5,534,837 | 7/1996 | Brandt | 336/155 |

FOREIGN PATENT DOCUMENTS

| | | |
|---|---|---|
| 0 398 485 | 11/1990 | European Pat. Off. . |
| 0 529 503 A1 | 3/1993 | European Pat. Off. . |
| A 58134409 | 8/1983 | Japan . |
| A 62015850 | 1/1987 | Japan . |
| A 1012510 | 1/1989 | Japan . |
| A 1091118 | 4/1989 | Japan . |
| 0023959 | 1/1990 | Japan ................... 257/531 |
| A 5013240 | 1/1993 | Japan . |
| A 5258937 | 10/1993 | Japan . |
| 2 080 044 | 1/1982 | United Kingdom . |
| 2 083 952 | 3/1982 | United Kingdom . |

Primary Examiner—Sara W. Crane
Assistant Examiner—Phat X. Cao
Attorney, Agent, or Firm—Kirschstein, et al.

[57] ABSTRACT

In a multichip module structure comprising a silicon, alumina or sapphire substrate carrying a plurality of layers of metallisation separated by polymer dielectric layers, with one or more inductors formed in the uppermost metallisation layer, a ferrite core for one of those inductors is located over the inductor and secured in position by flip chip solder bonding.

1 Claim, 1 Drawing Sheet

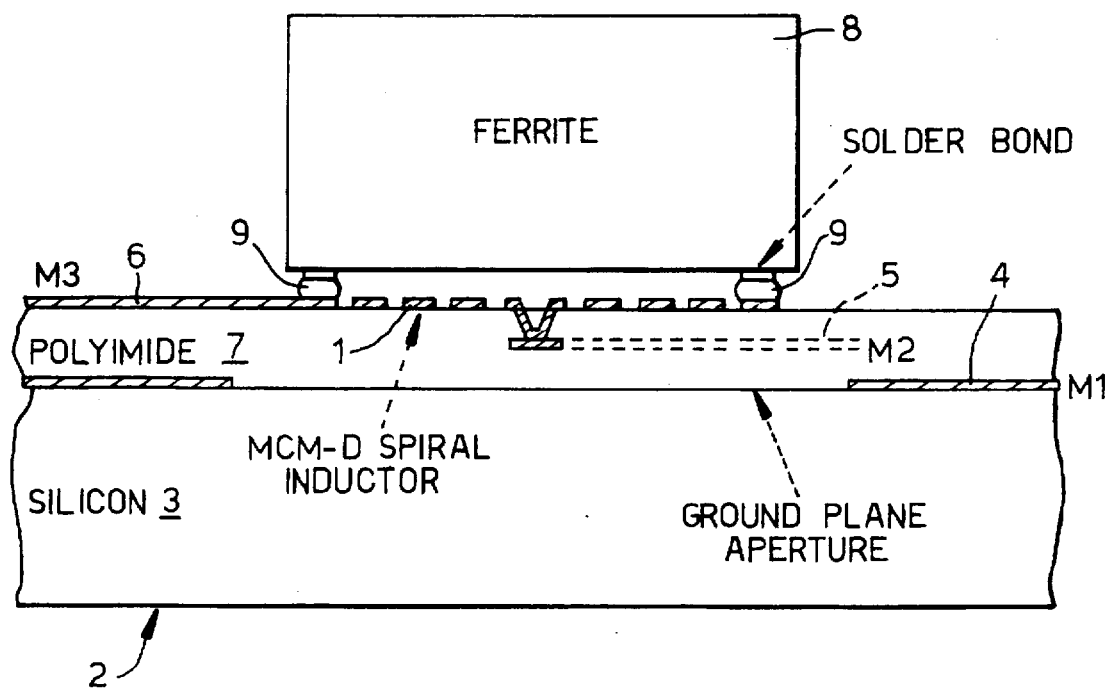

MULTI-CHIP MODULE INDUCTOR STRUCTURE

BACKGROUND OF THE INVENTION

There is a growing requirement, in the construction of very compact, low cost radios and other r.f. communications circuits, for small, high performance and cost effective inductor components.

Surface mountable chip inductors have recently become available that measure 2 mm by 1.25 mm in area and that offer inductance values up to some 20 nH, with self resonant frequencies of 1 to 2 Ghz and quality factors that peak at about 80 at about 0.5 of the self resonant frequency. These inductors are lithographically defined and employ a copper metallization for low resistance and high quality factor. Such components are available at typical costs of 60 cents each, with costs predicted to fall to 30 cents each as production volumes rise.

Very compact inductors may also be realized in an integrated form within the upper metallization layers of a multi-chip module type D (MCM-D thin film, deposited) substrate structure. Such inductors can provide inductance values between 1 and 100 nH within a 1 mm square footprint (using single or multilayer spiral structures), with self resonant frequencies between 20 GHz and 500 MHz. Quality factor in these MCM-D inductors is determined by the inductor resistance at low frequencies, while the peak quality factor is related to the nature and dielectric structure of the substrate employed. High resistivity silicon substrates with inductors defined in an aluminium-polyimide MCM-D structure can provide quality factors between about 5 and 20, depending upon the inductor structure and inductance value. The peak quality factor occurs at a frequency between 0.25 and 0.5 of the self resonant frequency. MCM-D inductors on sapphire or other good dielectric substrates can achieve quality factors up to 30 in the same system, with the peak quality factor occurring at about 0.5 of the self resonant frequency. The effective cost of such MCM-D inductors is directly related to the cost per unit area of the MCM-D technology, which is currently about 20 cents per square mm and will fall to 5 to 10 cents per square mm as production volumes rise.

Inductors may also be defined in the related MCM technologies, including MCM-C (cofired or post-fired ceramic) and MCM-L (fine line pcb or laminated) MCM technologies. While these latter MCM technologies involve generally coarser feature sizes and greater layer thicknesses, similar inductive components may be defined.

SUMMARY OF THE INVENTION

The accompanying drawing, labeled FIG. 1, shows a structure that provides very small, accurate, high value inductor components 1 integrated into an MCM-D substrate 2 structure. These inductors 1 employ a low resistivity metallization in a linear, arc or planar spiral format (square, circular or polygonal) defined in the MCM-D substrate structure 2. The MCM-D substrate structure itself involves a multilayer metallization plus organic polymer dielectric structure with typically a silicon, sapphire or alumina wafer. Copper or aluminium alloy metallizations 4, 5 and 6 are commonly employed for low resistivity, with polyimide, BCB or other thermally stable, low permittivity, interlayer dielectric materials 7.

The metallization layers 4, 5 and 6 are commonly allocated to provide a ground plane 4, a power plane or power distribution layer (not shown) and one or more signal interconnection layers 5 and 6. Integrated thin film passive components, including resistors, capacitors and inductors may be integrated into such substrate structures. The integrated inductor components are commonly implemented in the upper signal routing metallization layers 5 and 6. A linear, arc or planar spiral inductor geometry may be employed and the power and ground plane layers 4 may be omitted locally to minimize stray capacitance to ground (to maximize self resonant frequency) and to eliminate the image inductance term that can significantly reduce the effective inductance value. The lithographic processes employed to pattern the metallization layers 4, 5 and 6 ensure accurate inductance values for these integrated inductors. Single or multilayer inductor structures may be employed, the latter giving higher inductance in a given area.

In accordance with the invention a small ferrite chip 8 is flip chip solder bonded over the inductor 1 on the substrate to provide a local ferrimagnetic "core" for the inductor structure. The addition of this core acts to increase the inductance value for a given inductor design or allow a higher inductor quality factor to be achieved at a given value of inductance at a particular frequency.

BRIEF DESCRIPTION OF THE DRAWINGS

FIG. 1 illustrates the structure of this ferrite core MCM-D inductor.

DETAILED DESCRIPTION OF THE PREFERRED EMBODIMENT

The choice of ferrite material for the chip 8 will depend on the inductor application and, in particular, upon the frequency at which the inductor 1 is to be employed. Such materials are described, for example, in Chapter 4 of "Ceramic Materials for Electronics" edited by R. C. Buchanan, published by Marcel Dekker, Inc. Nickel zinc ferrites and manganese zinc ferrites may be selected for inductor core applications with permeabilities ranging from around 10 to over 1000, with operating frequencies of up to around 500 Mhz. In general the lower permeability materials show greater stability with temperature variation and a wider frequency operating range.

The use of the flip chip solder bonding technique for the location of the ferrite core over the MCM-D inductor structure offers a number of advantages. The highly accurate bond geometry and the self aligning nature of the flip chip bond structure, for example, ensures that the ferrite chip 8 is consistently located in both the lateral and vertical axes with respect to the inductor 1. This will ensure that the magnification of the inductance value associated with the addition of the flip chip ferrite core is also consistent and accurate. The small, controlled separation of the ferrite core from the MCM-D inductor itself (equal to the flip chip solder bond height and typically in the range from 10 to 100µ) will ensure that minimal stray capacitance is added to the inductor characteristics, whilst achieving effective magnetic coupling.

The lateral dimensions of the ferrite chip 8 may be selected to cover the full area of the MCM-D inductor 1 as required, while the ferrite chip thickness may be selected for consistency with the height of other components in the MCM-D assembly, for example to be equal to the thickness of adjacent silicon ICs (typically 0.5 mm). Established flip solder bond structures 9 and materials may be employed, for example solder bond lateral dimensions of 10 to 125 µm using a Cr—Cu—Au solderable metallization and a 95Pb-5Sn solder composition (wt %).

The flip chip ferrite core concept may be employed to extend the range of inductance values achieveable at a given MCM-D inductor geometry. If a magnification factor of 10 is assumed then, for example, a typical square spiral MCM-D inductor that provides an inductance approaching 25 nH for a 7 turn structure at 60µspiral pitch, with a quality factor of 9 at 850 MHz, may be extended to give a 250 nH inductor for use at lower frequencies. Alternatively the 7 turn, 25 nH inductor may be replaced by a 2 turn inductor at the same pitch, given a ferrite material that has suitable characteristics at 850 Mhz. This inductor, having a significantly reduced series resistance, will also display an increase in quality factor.

This general flip chip ferrite core concept may also be applied to other related MCM-D and ferrite structures where magnetic coupling effects may be exploited, for example in transformers, couplers and circulators.

I claim:

1. A multi-chip module inductor structure, comprising: a substantially planar substrate of electrically insulating material; a multilayer metallization/insulation structure formed on said substrate and comprising at least a lower metallization layer, a layer of electrically insulating material formed over said lower metallization layer, and an upper metallization layer formed over said layer of electrically insulating material; an inductor defined in at least said upper metallization layer; a substantially planar chip of ferrite material having upper and lower major surfaces; a plurality of solder bond pads defined in said upper metallization layer and a like plurality of solder bond pads formed on said lower major surface of said chip of ferrite material; and means, including a like plurality of solder bump connections, for attaching said chip of ferrite material over said planar inductor and in spaced relationship therewith.

* * * * *